United States Patent
Meier et al.

(10) Patent No.: US 10,811,326 B1
(45) Date of Patent: Oct. 20, 2020

(54) ACOUSTIC DETECTION OF LASER FAILURE MODE IN SEMICONDUCTOR ENVIRONMENT

(71) Applicant: Texas Instruments Incorporated, Dallas, TX (US)

(72) Inventors: Sebastian Meier, Munich (DE); Michael Garbe, Egglkofen (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/427,119

(22) Filed: May 30, 2019

(51) Int. Cl.
| | |
|---|---|
| H01L 21/00 | (2006.01) |
| H01L 21/66 | (2006.01) |
| G01H 9/00 | (2006.01) |
| G01D 5/24 | (2006.01) |
| B23K 26/362 | (2014.01) |
| H01L 21/268 | (2006.01) |
| H01L 23/544 | (2006.01) |
| G01D 5/14 | (2006.01) |

(52) U.S. Cl.
CPC .......... H01L 22/26 (2013.01); B23K 26/362 (2013.01); G01D 5/14 (2013.01); G01D 5/24 (2013.01); G01H 9/00 (2013.01); H01L 21/268 (2013.01); H01L 23/544 (2013.01)

(58) Field of Classification Search
CPC .............. H01L 21/268; H01L 21/4853; H01L 21/02631; H01L 21/76898; H01L 22/26; H01L 22/12; H01L 22/20; H01L 22/34; H01L 22/32; H01L 23/544; H01L 23/528; H01L 23/49838; H01L 23/50; B23K 26/362; B23K 26/032; B23K 26/702; B23K 26/034; B23K 26/127; G01D 5/14; G01D 5/24; G01D 5/145; G01D 5/26; G01D 5/266; G01D 5/2417; G01H 9/00; G01H 9/004; G01H 9/006; G01H 9/002; G01H 9/008
See application file for complete search history.

(56) References Cited

U.S. PATENT DOCUMENTS

| | | | |
|---|---|---|---|
| 6,957,581 B2* | 10/2005 | Gilgunn | G01N 29/14 438/10 |
| 7,190,441 B1* | 3/2007 | McWhirter | G01N 1/2813 356/36 |
| 2003/0207651 A1* | 11/2003 | Kim | B24B 37/013 451/6 |

OTHER PUBLICATIONS

"Acoustic Sensor" of Springer-Verlag. Berlin, 1980. 10. Morse, P.M. Vibration and Sound. McGraw-Hill, New York at https://link.springer.com/content/pdf/10.1007%2F0-387-21604-9_12. (Year: 1980).*

* cited by examiner

Primary Examiner — Nikolay K Yushin
(74) Attorney, Agent, or Firm — Rose Alyssa Keagy; Charles A. Brill; Frank D. Cimino

(57) ABSTRACT

A method of detecting undesired surface effects while lasing a semiconductor during a laser marking, (dicing, fuse cutting or otherwise) process. A detection device is placed near the site of semiconductor lasing to detect erroneous laser markings resulting in the undesired surface effects. Upon identifying such a condition, lasing may be interrupted in-process.

15 Claims, 8 Drawing Sheets

US 10,811,326 B1

ACOUSTIC DETECTION OF LASER FAILURE MODE IN SEMICONDUCTOR ENVIRONMENT

BACKGROUND

Lasers are often used during the fabrication of semiconductors for photovoltaics, displays, microelectromechanical systems (MEMS) and other technologies involving fabrication using thin films. The lasers may be of both the pulsed or continuous variety that rely on a shutter or some other mechanism to deflect and move a laser spot. For example, laser marking, laser trimming, laser etching and micro drilling (such as that done with printed circuit boards (PCBs)), laser dicing and laser scribing are all common procedures wherein a laser is used during semiconductor fabrication. During procedures such as laser scribing, proper configuration and operation of a laser beam involves melting the surface of a semiconductor material to create what is commonly known as a soft mark. Soft marks are regarded as marks, dents, smooth holes or valleys in the surface of a semiconductor which generally result with no debris as a consequence of marking. An array of soft marks may provide identification information, such as barcode information, Quick Response Code (QR) or text, on each wafer in a fabrication production line of semiconductor devices.

FIG. 1 illustrates a perspective view of a laser pulse on a semiconductor substrate. FIG. 1 depicts laser beam 100 producing deleterious effects on substrate 102 ranging from evaporation, cracking, excessive heat and various surface damage. While the use of lasers are essential to the production of semiconductor devices, too much laser energy per time interval per area (or power per area) may cause unwanted effects, such as those mentioned above and depicted in FIG. 1, by fluctuation of laser beam 100 or other process errors These process errors include component failure such as laser shutter malfunction or failure and incorrect laser calibration or over-exposure to laser beam 100. Recast particles 104, shockwaves 106, microcracks 108, surface debris 110, ejected molten material 112, surface ripples (due to shockwave(s) 114) and damage to adjacent structures 116 are examples of damage to semiconductors devices that can occur due to the undesired expansion or evaporation of semiconductor material.

An improperly set, mis-calibrated or unstably functioning laser beam exhibiting sporadic power variation may damage semiconductor material being processed. FIG. 2 shows a cross-sectional view of a semiconductor material showing damage from a laser beam in that holes 205 in the semiconductor material are produced having a depth of over 60 microns, which is well over the intended depth of 4 microns for a normal soft mark. In addition, this damage also results in recast particles 210.

FIG. 3 illustrates a scanning electron microscope (SEM) image of a wafer marking showing a plurality of soft marks for a wafer. In the example depicted by FIG. 3, the marking includes both normal soft marks 305 and defective marks 310. Defective marks 310 may be produced, for instance, when the laser operates in error and evaporates the surface of the semiconductor device. Typically, visual inspections are performed after the marking process is complete. However, performing a visual inspection after the marking process presents problems since not every marking site is tested, and because there is a chance that defective marks 310 will be overlooked and the damaged semiconductor will continue to be processed. Additionally, because the inspection is done after the marking process is complete, servicing of the laser marking tool will be delayed until after the marking process and visual inspection.

Based on the foregoing, there is a need in the art for in-line detection of laser failure during semiconductor device fabrication.

SUMMARY

A method of semiconductor processing is provided including placing a detection device near the surface of a semiconductor; directing a laser beam, onto the surface according to a semiconductor processing step; monitoring the semiconductor processing step with the detection device; and pausing the semiconductor processing step in connection with detection of laser operating characteristics, by the detection device, that are associated with damage to the surface of the semiconductor.

The foregoing, and other features and advantages of the disclosure, will be apparent from the following, more particular description of the examples of the disclosure, the accompanying drawings, and the claims.

BRIEF DESCRIPTION OF THE DRAWINGS

For a more complete understanding of the present disclosure, the objects and advantages thereof, reference is now made to the ensuing descriptions taken in connection with the accompanying drawings briefly described as follows.

DETAILED DESCRIPTION

Figure 1:
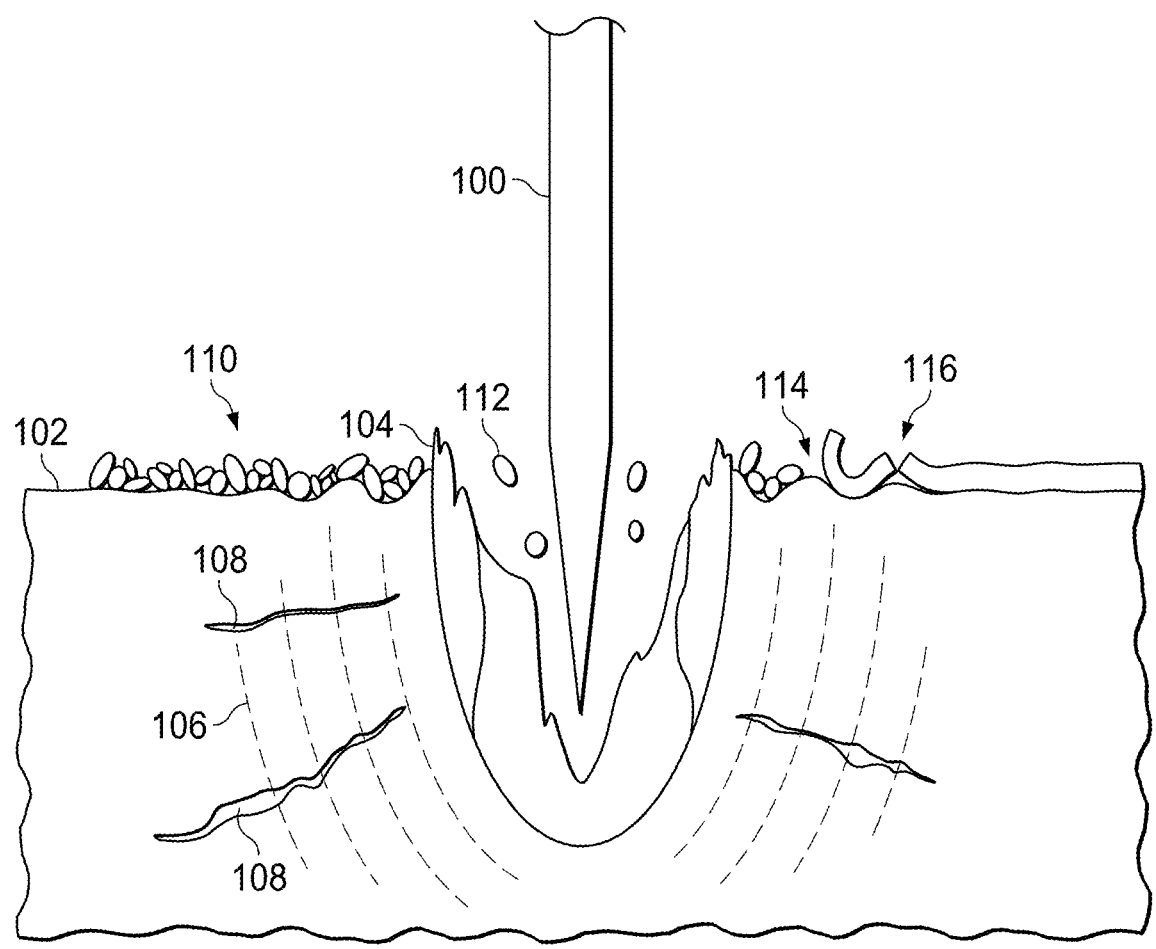
FIG. 1 illustrates a perspective drawing depicting a laser beam causing a shock wave on semiconductor material.
Figure 2:
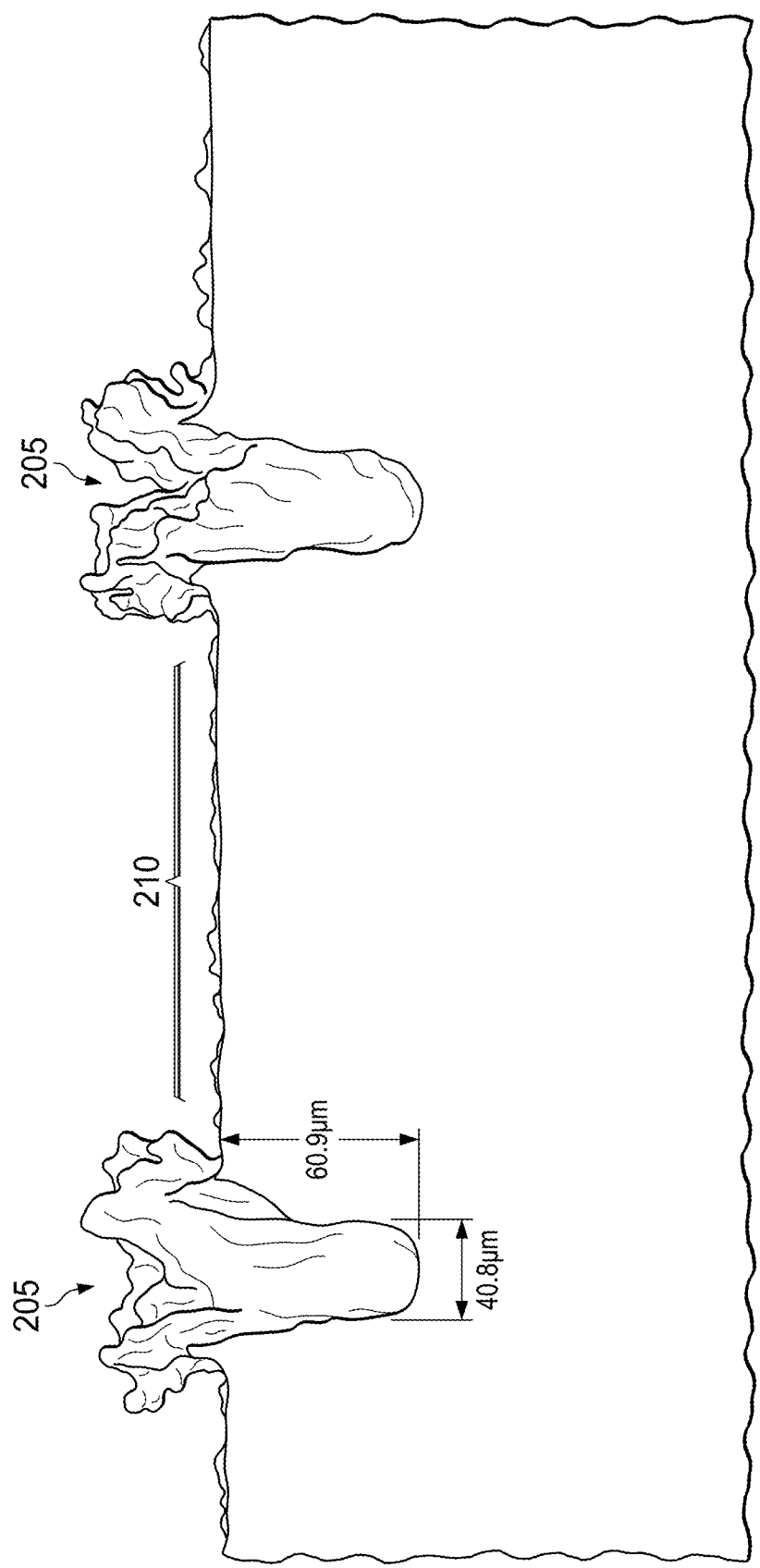
FIG. 2 shows a cross-sectional view of a semiconductor material having experienced evaporation from a laser beam, according to an example.
Figure 3:
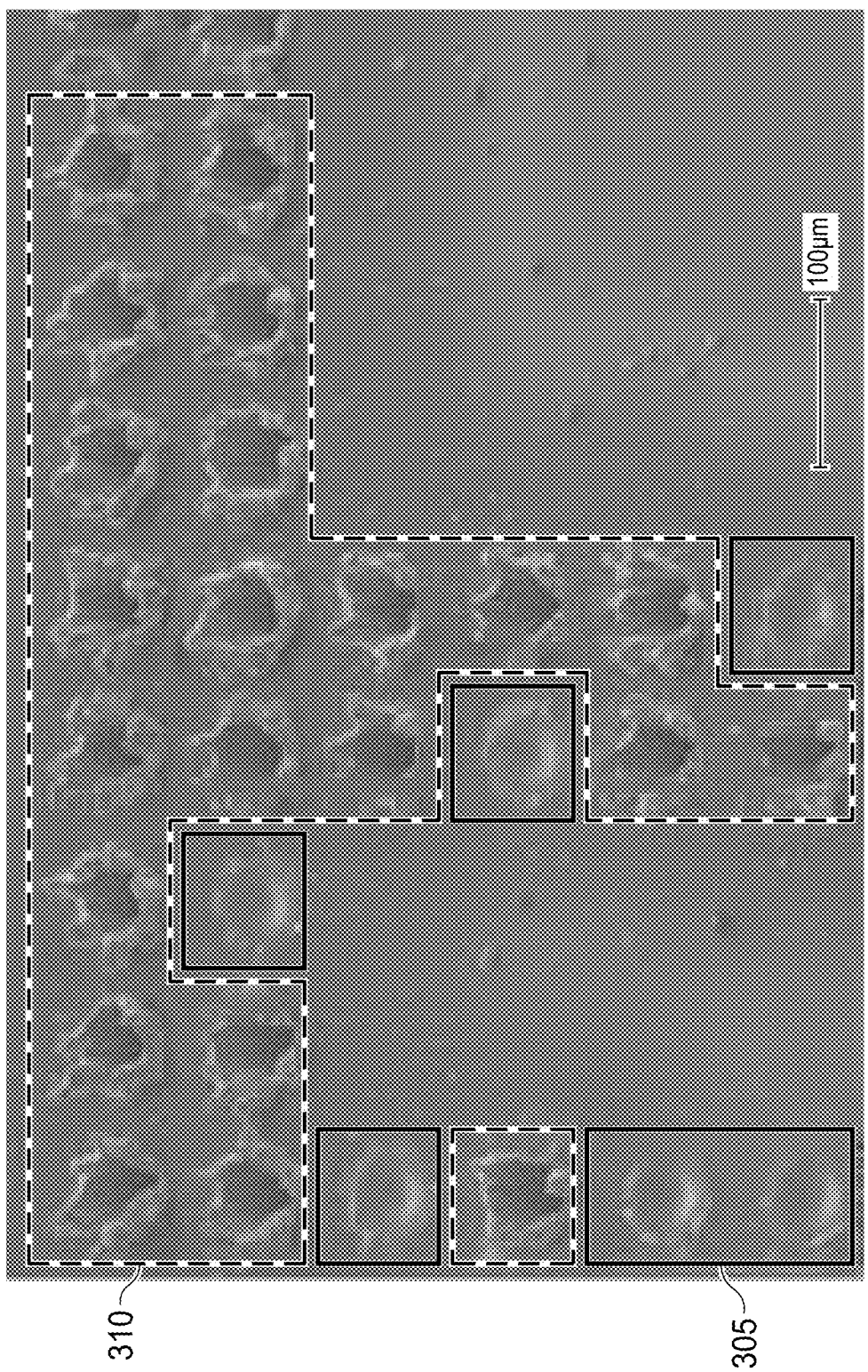
FIG. 3 illustrates a SEM image of a wafer marking showing a plurality of soft marks forming a laser marking array on a wafer. Some sites on the marking array show signs of sporadic or irregular evaporation due to lasing.

Examples of the present disclosure and their advantages may be understood by referring to FIGS. 4-7, wherein like reference numerals refer to like elements.

Figure 4:
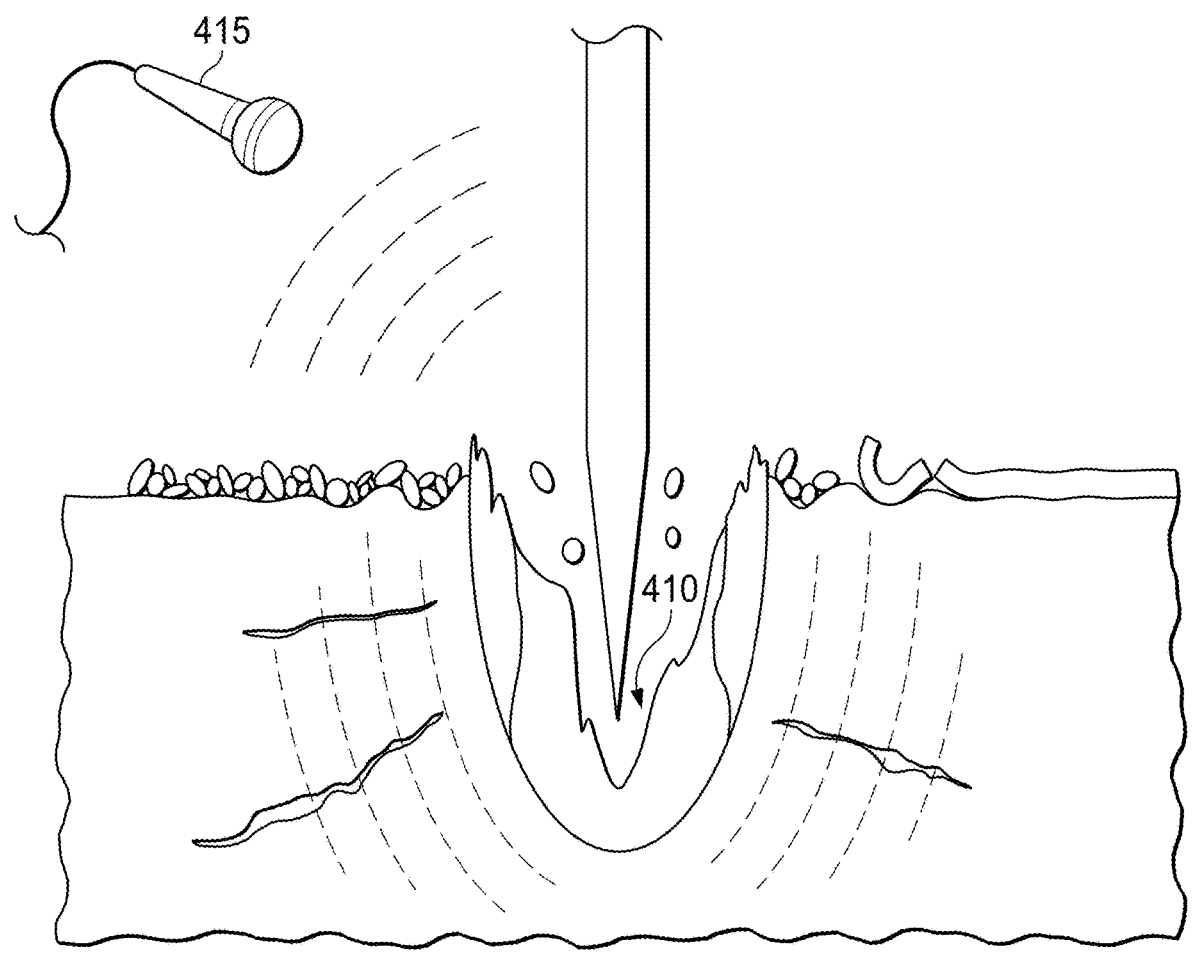
FIG. 4 illustrates a perspective drawing showing a microphone used for detecting high-frequency noise caused by a laser beam evaporating semiconductor material.

FIG. 4 illustrates a perspective drawing showing a microphone used for detecting sound waves in connection with lasing semiconductor material, according to an example. Sounds waves generated due to the expansion of the semiconductor material may be detected by microphone 415. Consequently, defect such as deep mark 410 may generate a characteristic sound associated with undesired surface effects (evaporation, cracking, or various surface damage of a semiconductor material) through which microphone 415 enables detection. This allows for the marking process to be paused such that the laser can immediately be interrupted (for laser repair, laser substitution, etc.) thus preventing future damage to the semiconductor material. The term 'microphone' as used herein may refer to any device capable of acoustic detection.

In an example, intentionally provoking evaporation of semiconductor material may be generated by the varying laser power through changing the laser Q-switching frequency. Q switching of a laser results in a pulsed laser output beam. The resulting light pulses generally have a much higher peak power than that which would be produced operating in a continuous wave mode. In one example, Q-switching involving increasing the laser Q switching frequency may result in decreasing the laser power. By contrast, decreasing the Q-switching frequency may result in increasing the laser power.

Figure 5A:
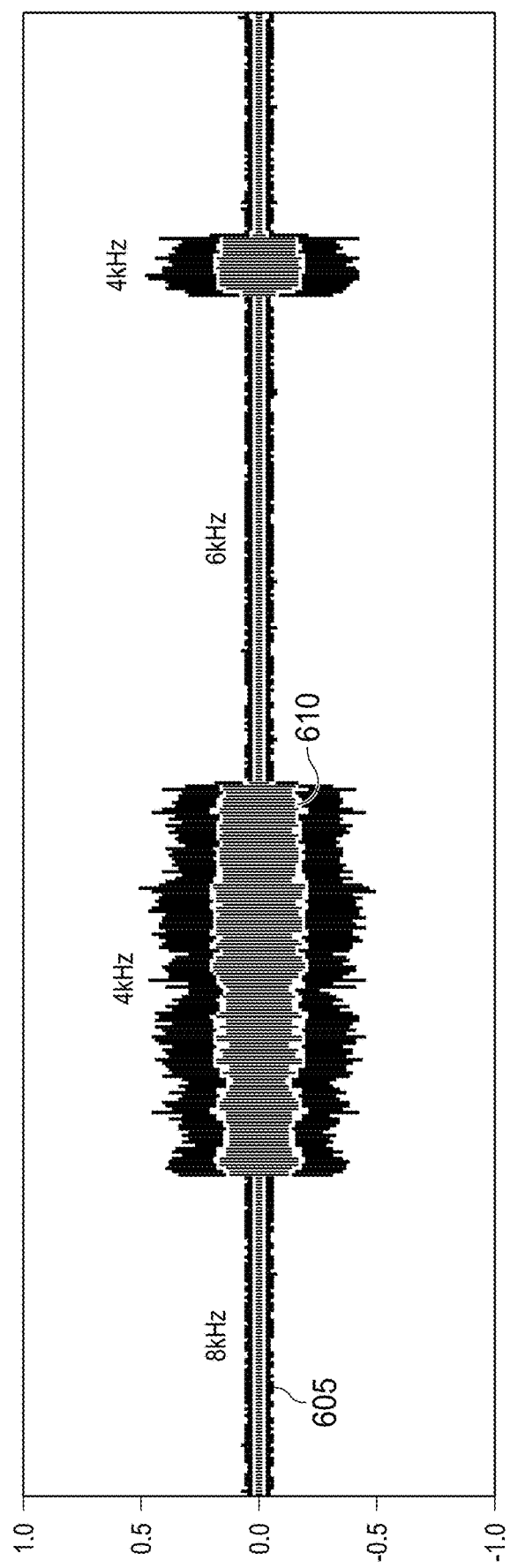
FIG. 5A illustrates a diagram showing a microphone output signal during operation of a laser on a workpiece (not shown) which may be a semiconductor material.

FIG. 5A illustrates a diagram showing a detected acoustic signal during operation of a laser, (with Q-switching frequencies noted) on a workpiece (not shown) which may be a semiconductor material. Low frequencies that might otherwise be shown may be filtered out using software. Additionally, an electronic low-cut filter may remove low frequencies, as well. During abnormal of laser application, a laser may cause evaporation, cracking, or various surface damage to a semiconductor material. With reference to FIG. 5A, under normal conditions, (for example, with a Q-switch frequency of 8 kHz,) this may be representative of a scenario where evaporation, cracking, or various surface damage to the semiconductor material is not detected (and not present). In such an example, wherein evaporation, cracking, or various surface damage on the semiconductor material is not detected, this may representative of a baseline state. Laser use, associated with abnormal operation, may produce evaporation, cracking, or various surface damage on the semiconductor material, and it may result in, for instance, a deeper mark in the semiconductor than intended. As noted, a higher-powered laser beam may be achieved, for instance, in connection with a lower Q-switch frequency being used in lasing. FIG. 5A shows the greater amplitude 610 which may be detected at the site of an application of a laser with a Q-switch frequency of 4 kHz as compared with the normal amplitude 605 detected in conjunction with a laser operating with a 6 kHz or a 8 kHz Q-switch frequency. As noted, this greater amplitude 610 of the signal detected may be indicative of evaporation, cracking, or various surface damage on a semiconductor material.

Figure 5B:
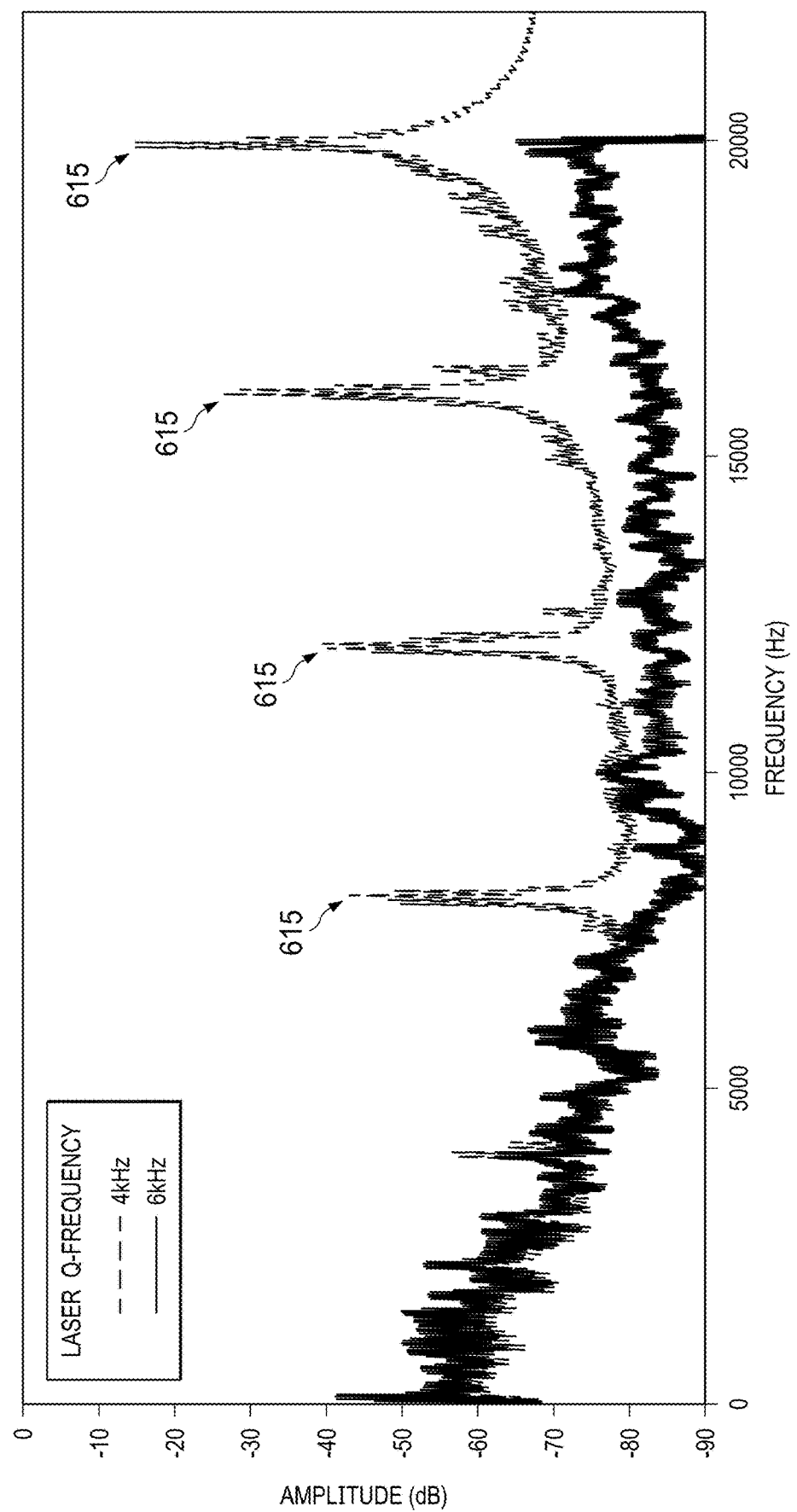
FIG. 5B illustrates a graph of laser amplitude plotted against sound frequency, detected at the site of the laser impact upon a surface, as depicted by a spectrum analyzer, during abnormal operation of a laser and normal operation of the laser (as indicated in the graph), distinguished by Q switching frequency.
Figure 5C:
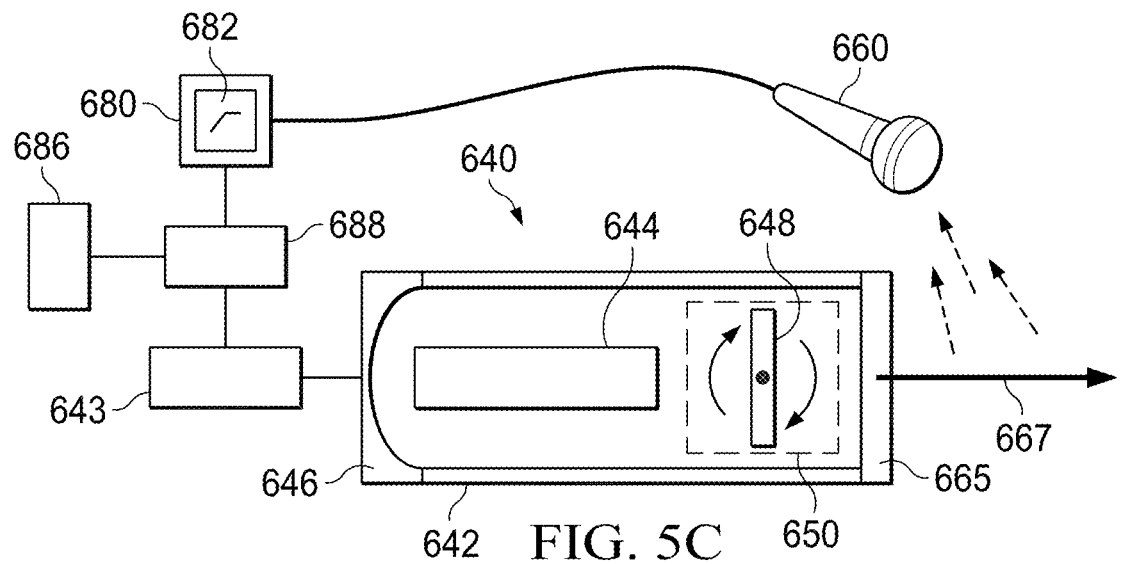
FIG. 5C illustrates a perspective view of a laser device having a detection mechanism for detecting non-desirable laser operation, in process, while producing a soft mark on a substrate.

FIG. 5B illustrates a graph of laser amplitude plotted against sound frequency, detected at the site of the laser impact upon a surface, as depicted by a spectrum analyzer, during abnormal operation of a laser, causing evaporation, cracking, or various surface damage on a semiconductor material, according to an example. In the example, as depicted in FIG. 5B, the 4 kHz Q-switched laser provides a higher energy laser beam, as explained herein, and its operation, for this example, connotes abnormal operation causing evaporation, cracking, or various surface damage on the semiconductor material. These surface effects may be indicative of a power surge in a malfunctioning laser and/or they may be representative lasing for too long of a period of time-sufficient to produce the undesired surface effects (evaporation, cracking, or various surface damage on the semiconductor material). The undesired surface effects may occur in connection with a shockwave produced in the semiconductor material, by lasing. The shockwave may manifest itself, among other things, as a high frequency sound. Similarly, in connection with a laser producing the undesired surface effects noted, a high frequency sound may be detected using a microphone and a high pass filter. In an example, a spectrum analyzer displays large peaks 615 in amplitude, at the frequencies shown, of the captured sound which may be attributable to the undesired surface effects. These undesired surface effects register on a spectrum analyzer as peaks 615 with an intensity increase of more than 20 decibels (dB) above the other signal levels displayed which are representative of laser operation without causing shockwaves. Software using a peak-finder algorithm may be employed to find peaks 615 in the detected signal which are indicative of undesirable surface effects, such as shockwaves, to distinguish, without the need for human perception, abnormal laser processing/operation from normal laser processing/operation FIG. 5C illustrates a perspective view of a laser device having a detection mechanism for detecting non-desirable laser operation, in process, while producing a soft mark on a substrate. Q-switched laser 640 includes cavity 642 in which medium 644 lies. Cavity 642 encloses mirrors 646 and 648 (a rotating mirror) at opposite ends. An energy pumped medium 644 is continued within cavity 642. The pumping may be accomplished, for instance by a light source or electric current from pump 643 which energizes the electrons within the medium 644. Shutter 650 operates according to a Q-switching mechanism. In Q-switching, electrons are pumped with energy to cause them to transition to a higher energy state via stimulated absorption. Some of the exited electrons will transition down to a metastable energy state, should one exist, in the medium 644. A photon striking an electron in a metastable state may cause that electron to emit an additional photon via spectral emission down to a lower energy state. A population inversion may occur where more electrons exist in the metastable state than in the ground state. By rotating mirror 648 so that it is not lined up with mirror 646 a shuttering effect is produced represented by shutter 650 so that energy loss associated with cavity 642 is increased as photons are prevented from traveling back and forth between mirror 646 and rotating mirror 648 (preventing a laser beam). Energy is still being pumped to medium 644 in cavity 642 and that energy is being stored medium 644, placing more electrons in an active state and increasing the population inversion. In connection with aligning mirrors 646 and 648 (opening shutter 650), photons are allowed to moved back and forth between mirrors 646 and 648, thereby allowing-switched laser 640 to lase photons. The mechanism of opening the shutter reduces the amount of energy loss associated with cavity 642 and population inversion is reversed through the cavity releasing a burst of photons, through output coupler 665, forming laser beam 667. Q switching relates to the quality factor which is defined as the emission frequency divided by the spectral width. Q which may be synonymous with quality may be defined as $2\pi*$ energy stored in a cavity/energy loss per optical cycle. As such, Q switching is a manner of operating a laser wherein the quality is reduced by increasing the energy loss in a laser cavity followed by increasing the quality by decreasing the energy loss in the laser cavity.

A lower Q leads to higher laser output power as a longer time interval to build the population inversion translates into an opportunity to create more photons for lasing. Should the laser Q-switch frequency decrease, producing a lower Q, a deleterious condition may be produced in connection with using the q-switched laser in operations such as wafer soft marking since a higher intensity laser beam may damage a wafer. Alternatively, application of a laser beam for too long of a period at a site on a surface (semiconductor surface or otherwise) or at too high of a power (for too long of a time period) sufficient to produce the undesired surface effects, as noted herein, may produce a detectable shockwave. Microphone 660 may serve to send sounds, associated with the detectable shockwave, emanating from the material being lased or treated to detector 680 so that the undesired surface effects situation (e.g., evaporation, cracking, or various surface damage of a material) may be addressed. Detector 680 may include high pass filter 682 and it may include processor 688 or an operational link to a processor, either on site or remotely located. High pass filter 682 filters allow only high frequency sounds of the type expected to be indicative of the undesired surface effects noted herein. Empirical data is collected in connection with determining lasing sound intensity levels associated with harmful lasing effects on a semiconductor surface. This empirical data may be used in connection with database 686, coupled to detector 680, and used with processor 688 to set the level of detection necessary to register in database 686, sound intensity and attendant frequencies of a shockwave indicative of undesired surface effects. Further, processor 688 may control the lasing operations in connection with processing information received from database 686 to which processor 688 is coupled. In connection with detecting such sound intensity at attendant frequencies, the laser in use may be deactivated for purposes which may include repair or replacement of the laser. Additionally, or alternatively, laser processing parameters may be set or reset as a remedy to prevent further operation causing undesired surface effects.

Figure 6:
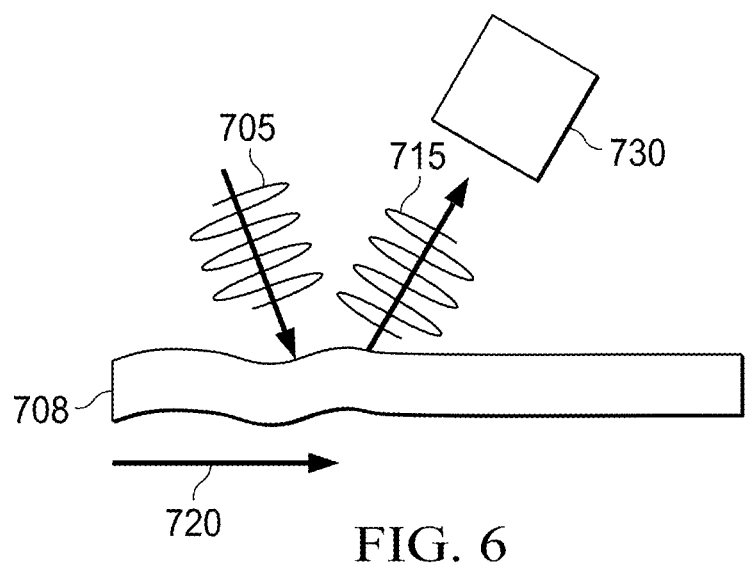
FIG. 6 illustrates a side view of a substrate showing incident and reflected laser beams, and the attendant shockwave propagation, on the substrate.

FIG. 6 illustrates a side view of substrate 708 showing incident coherent light 705 incident on substrate 708 and reflected coherent light 715 reflected from substrate 708. FIG. 6 is intended to show that there may be a shift in phase from the phase of incident coherent light 705 and the phase of reflected coherent light 715 due to laser beam 667 causing shock wave 720 in substrate 708. This may be considered a form of phase shifting interferometry using coherent light. Further, laser Doppler velocimetry techniques are also contemplated where the Doppler shift in a laser beam may be used to measure vibrational motion of an object such as a semiconductor surface. The coherent light may even be laser light.

In some examples non-contact type vibration sensor 730 may be a noncontact displacement sensor which uses either capacitive or eddy-current displacement-type sensors to probe the surface of a vibrating object. Further, a laser Doppler vibrometer may be used for non-contact type vibration sensor 730. Should the phase shift detected between the phases of incident coherent light 705 and reflected coherent light 715 be outside of an acceptable range, this situation that may require interruption of the lasing processing. A laser Doppler vibrometer is generally a two-beam laser interferometer that measures the frequency (or phase) difference between an internal reference beam and a test beam. The test beam is directed to the target, and scattered light from the target is collected and interfered with the reference beam on a photodetector, typically a photodiode. Most commercial vibrometers work in a heterodyne regime by adding a known frequency shift (typically 30-40 megahertz (MHz)) to one of the beams. This frequency shift is usually generated by a Bragg cell, or acousto-optic modulator.

Figure 7:
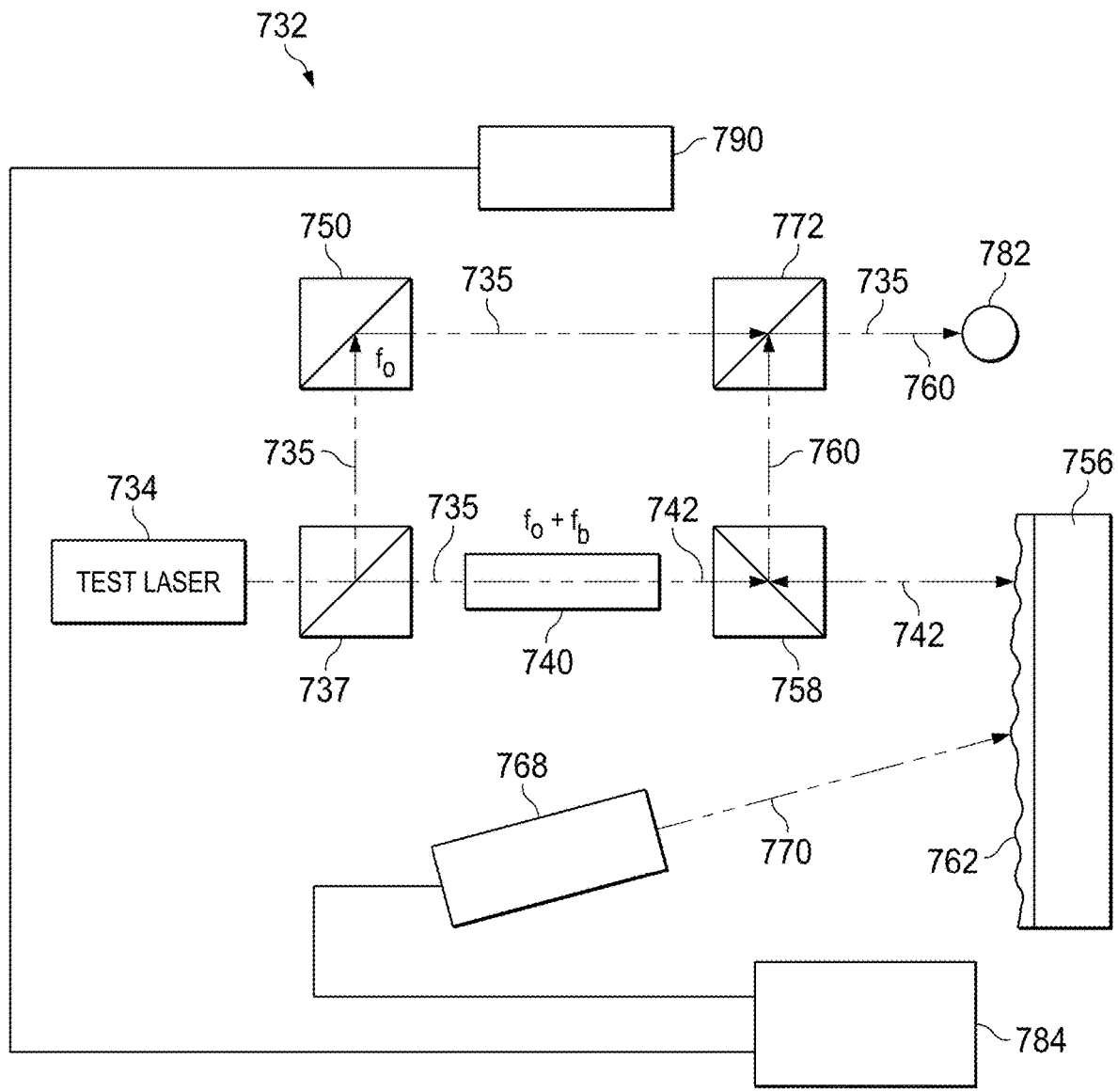
FIG. 7 illustrates a perspective view of a phase shift detection system.

FIG. 7 illustrates a perspective view of a phase shift detection system implementing the foregoing. In FIG. 7, a non-contact type vibration sensor is implemented as a laser Doppler vibrometer 732. Test laser 734 emits a reference laser beam which beam splitter 737 splits into two laser beams each labeled reference beam 735.

Bragg cell 740, through heterodyning, contributes a carrier signal with a frequency, $f_b$, to laser beam 735. This results in composite laser beam 742 having a composite frequency equal to $f_b$ plus the original reference frequency, $f_o$, of reference beam 735. Composite laser beam 742 passes unmodified through beam splitter 758 and is emitted onto the surface of the semiconductor material 756. The composite laser beam 742 is reflects off of semiconductor material 756 to produce a reflected beam with frequency $f_o+f_b$ which may be modulated by Doppler shift frequency $f_d$. A Doppler shift produces Doppler shift frequency, $f_d$, may be caused by a shockwave 762 in connection with lasing of semiconductor material 756 by production laser 768 with production laser beam 770.

The reflected beam is received by the beam splitter 758 and the reflected beam 760 is directed to beam splitter 772. Beam splitter 772 directs the reference beam 735 and reflected beam 760 to photo detector 782. A processor, in conjunction with the photo detector 782, may be used to subtract the frequency of reference beam 735 from the frequency of laser beam 760. Since the frequency contributed by Bragg cell 740 is known, the Doppler shift frequency, $f_d$ may be determined.

Using stored empirical data, laser operation associated with undesired surface effects may be determined. In conjunction with identifying Doppler shift frequencies identified with undesired surface effects. A processor coupled to the photo detector 782 may send notifications to controller 790 which controls the lasing process for semiconductor material 756 undergoing laser processing by production laser 768. Controller 790 may be programmed to stop the lasing process in connection with a notification that a detected Doppler shift frequency falls into a category indicative of undesired surface effects occurring on the semiconductor material.

Other sensors are contemplated for non-contact type vibration sensor 730 besides those disclosed by the foregoing. As demonstrated herein a time-dependent phase shift may be indicative of vibration. As with the acoustic examples provided herein, there is an attendant vibration in kHz frequency ranges. These vibrations may be resolved into time and frequency domain representations by measuring and plotting the deflection of the lased material when vibrating.

The disclosure provided herein the use of one specific example for the purposes of illustration only. It will be readily apparent to one of ordinary skill in the art, however, that the principles of the disclosure can be embodied in other ways. Therefore, the disclosure should not be regarded as being limited in scope to the specific examples disclosed herein, but instead as being fully commensurate in scope with the following claims.

We claim:

1. A method of semiconductor processing, comprising:
   placing a detection device near a surface of a semiconductor substrate;
   directing a laser beam, from a laser, onto the surface of the semiconductor substrate according to a semiconductor processing step;
   monitoring acoustic vibration on the surface of the semiconductor substrate during the semiconductor processing step with the detection device; and
   pausing the semiconductor processing step in connection with detection of laser operating characteristics, by the detection device, that are associated with damage to the surface of the semiconductor substrate.

2. The method of claim 1, wherein the laser is a Q-switched laser.

3. The method of claim 2, further comprising the step of calibrating a normal Q-switched operating frequency and intensity level, for the laser, wherein the detection of laser operating characteristics, includes detection of an intensity increase beyond a predetermined decibel level.

4. The method of claim 1, wherein the detection device includes a microphone.

5. The method of claim 4 wherein the laser is a Q-switched laser.

6. The method of claim 1, wherein the detection device includes a coherent light source, directed at the surface of the semiconductor.

7. The method of claim 6 wherein the detection device includes a phase shift detection system.

8. The method of claim 7 wherein the phase shift detection system includes a photo detector to receive incident coherent light from the coherent light source and reflected coherent light reflected from the surface of the semiconductor.

9. A system comprising:
a laser;
a microphone coupled to the laser; and
a microprocessor coupled to the microphone, wherein the microprocessor is operable to cause deactivation of the laser in connection with the microphone receiving sound of an intensity above a predetermined level.

10. A system comprising: a laser emitted onto a semiconductor substrate causing a shock wave in the semiconductor substrate; a coherent light source directed at a surface of the semiconductor substrate; a detector coupled to the coherent light source, the detector monitoring acoustic vibration of the shock wave in the semiconductor substrate; and a microprocessor coupled to the detector, wherein the microprocessor is operable to cause deactivation of the laser in connection with the detector detecting a change of phase due to the shock wave, above a predetermined level, between coherent light from the coherent light source incident on the semiconductor substrate and a reflected coherent light from the semiconductor substrate.

11. The system as recited in claim 10 wherein the detector includes photo detector.

12. The system as recited in claim 10 wherein the detector is a laser Doppler vibrometer.

13. The system as recited in claim 10 wherein the detector is a noncontact displacement sensor.

14. The system as recited in claim 13 wherein the noncontact displacement sensor is a capacitive displacement-type sensor.

15. The system as recited in claim 13 wherein the noncontact displacement sensor is an eddy-current displacement-type sensor.

\* \* \* \* \*